US006181562B1

(12) United States Patent
Berg et al.

(10) Patent No.: US 6,181,562 B1
(45) Date of Patent: Jan. 30, 2001

(54) DEVICE AND METHOD FOR MOUNTING ELECTRONIC COMPONENTS ON PRINTED CIRCUIT BOARDS

(75) Inventors: Rustan Berg, Kode; Ingemar Hernefjord, Kållered, both of (SE)

(73) Assignee: Telefonaktiebolaget LM Ericsson (publ), Stockholm (SE)

( * ) Notice: Under 35 U.S.C. 154(b), the term of this patent shall be extended for 0 days.

(21) Appl. No.: 09/348,036

(22) Filed: Jul. 6, 1999

(30) Foreign Application Priority Data

Jul. 7, 1998 (SE) .................................................... 9802444

(51) Int. Cl.[7] ...................................................... H05K 7/20
(52) U.S. Cl. ......................... 361/719; 361/717; 361/721; 361/734; 257/768; 257/753; 228/180.22; 439/566
(58) Field of Search ................................... 361/702–719, 361/717–729, 723–727, 768, 749–751; 257/701–707, 717, 720, 774, 753, 762, 764, 772, 751, 766, 737, 763, 747, 731; 174/152 GM, 61–60; 439/566, 599, 92, 364; 228/180.22, 175, 189, 180.21; 29/840; 428/457, 209, 343, 344, 458, 688, 902, 455, 686, 901

(56) References Cited

U.S. PATENT DOCUMENTS

| | | | | |
|---|---|---|---|---|
| 3,597,658 | * | 8/1971 | Rivera ................................ | 317/234 R |
| 4,556,899 | * | 12/1985 | Kurihara et al. ........................ | 357/80 |
| 5,109,597 | | 5/1992 | Sharp et al. . | |
| 5,324,987 | * | 6/1994 | Iacovangelo et al. ................ | 257/701 |
| 5,471,092 | * | 11/1995 | Chan et al. ........................... | 257/753 |
| 5,521,438 | * | 5/1996 | Okamoto et al. ..................... | 257/703 |
| 5,874,776 | * | 2/1999 | Kresge et al. ........................ | 257/747 |

FOREIGN PATENT DOCUMENTS

| | | | |
|---|---|---|---|
| 7-106751 | | 4/1995 | (JP) . |
| 410107405A | * | 4/1998 | (JP) ................................ H05K/3/32 |

OTHER PUBLICATIONS

Patent Abstract of Japan, 9–120971 A, May 6, 1997.

* cited by examiner

Primary Examiner—Leo P. Picard
Assistant Examiner—Michael Datskovsky
(74) Attorney, Agent, or Firm—Burns, Doane, Swecker & Mathis, L.L.P.

(57) ABSTRACT

The present invention relates to mounting an electric connector (20) onto a printed circuit board, particularly to a printed circuit board comprised of ceramic material, for instance either an LTCC substrate or an HTCC substrate. The problem addressed is one where the connector (20) tends to loosen from the substrate when the temperature varies. This is due to the difference in the coefficients of thermal expansion of the printed circuit board and the connector (20). The problem is solved with the aid of a so-called shim (10) that has a coefficient of thermal expansion between that of the printed circuit board and that of the connector. One side of the shim (10) is soldered onto the connector and the other side of the shim is soldered onto the printed circuit board. The connector (20) is therewith fastened to the printed circuit board. Shear stresses acting between the connector (20) and the printed circuit board are distributed through said board through the medium of two joints instead of one. The connector may alternatively be provided with a built-in shim.

19 Claims, 2 Drawing Sheets

DEVICE AND METHOD FOR MOUNTING ELECTRONIC COMPONENTS ON PRINTED CIRCUIT BOARDS

This application claimes priority under 35 U.S.C. §119 and/or 365 to 9802444-1 filed in Sweden on Jul. 7, 1998; the entire content of which is hereby incorporated by reference.

FIELD OF INVENTION

The present invention relates to the field of electronics, and more particularly to a shim, a component and a method of mounting a component on a printed circuit board. The invention also applies to a printed circuit board that has a component mounted thereon. More specifically, the printed circuit board is a ceramic type board.

BACKGROUND OF THE INVENTION

Microwave components have traditionally been mounted on hard substrates. By hard substrate is meant here a board comprised of ceramic material. Electrical metal conductors have been provided on the substrate. In the case of microwave technology, the electrical conductors are designed to constitute electrical components in themselves. Naturally, the conductors also serve to connect components mounted on the substrate. An undesired function of the electrical conductors is that they also function as antennas in microwave applications. Consequently, the electrical components must be shielded/screened against interference, so as not to transmit signals or receive interference signals originating from outside sources. This is effected by encapsulating and hermetically sealing the substrate. Electrical conductors are drawn through the wall of the capsule for connecting the capsule to other devices and equipment.

Electrical conductors are made of metal, whereas the capsule is sometimes made of ceramic material, similar to the substrate. Metal is subjected to thermal expansion, whereas the ceramic capsule will not expand in response to higher temperatures, at least not to a significant extent in comparison with the metal. The differences between the coefficients of thermal expansion of the materials means that the transit or lead-through in the capsule wall is difficult to seal hermetically.

U.S. Pat. No. 5,109,594 teaches a solution to this problem, with the aid of a bi-metal expansion collar fitted in a hole in the capsule wall. The electrical conductor is then inserted through the collar. The collar forms a packing which seals between the electrical conductor and the hole-defining walls. The collar is made of two materials that have coefficients of thermal expansion which lie between that of the metal conductor and that of the capsule wall-the one close to the coefficient of thermal expansion of the capsule wall and the other close to the coefficient of thermal expansion of the metal. The two materials of the collar are separated axially. That end of the collar whose coefficient of thermal expansion lies close to that of the capsule is fastened to the capsule, and the opposite end of said collar is welded to the metal conductor.

In recent times, the technology concerning the manufacture of hard substrates has been developed so as to enable the boards to be provided with several layers of conductors in manufacture, in addition to surface layers. A substrate which will allow this is designated an LTCC substrate (Low Temperature Cofired Ceramic), while another functional substrate in this respect is the HTCC substrate (High Temperature Cofired Ceramic). Such substrates are referred to as hard multilayer substrates in the following text. Conductors in the various layers are connected through vias. A hard multilayer substrate produced in accordance with this development will function as a printed circuit board. Although hard substrates are suitable for use with microwave electronics, the use of hard multilayer substrates is not restricted solely to microwave electronics.

Encapsulation of layers of conductors within the hard multilayer substrate can be avoided, by screening the conductors against interference through the medium of earth planes on both sides. Although encapsulation is still required in respect of surface mounted components and conductors, it is not necessary to encapsulate the entire hard multilayer substrate, but solely the part or parts that carry microwave components or conductors on the surface plane. The encapsulated parts of the hard multilayer substrate are connected electrically via conductors in layers within the substrate.

In recent times, it has also been possible to manufacture hard multilayer substrates with surfaces measurements that correspond with A4 sizes. Hard multilayer substrates are brittle as distinct from printed circuit boards that include plastic instead of ceramic as insulating layers. It is therefore not possible to rivet electrical connectors to the hard multilayer substrate. Components and electrical connectors to be mounted on the substrate must therefore be surface mounted. One difficulty in respect of surface mounted components and electrical connectors is one of ensuring that the components and connectors will remain firmly seated when the temperature varies. This difficulty is due to the fact that the materials in the surface mounted components and connectors have thermal expansion coefficients that are different to that of the printed circuit board. Microwave electronics often operate with high powers and therewith high heat generation.

SUMMARY OF THE INVENTION

The present invention addresses the problem of ensuring that a surface mounted component, for instance an electrical connector, will remain seated firmly in a printed circuit board when the temperature varies and when the printed circuit board and electrical connector have mutually different coefficients of thermal expansion. This problem is particularly difficult to overcome in the case of printed circuit boards that have the form of hard multilayer substrates, since the difference between the coefficient of thermal expansion of such substrates and the coefficient of thermal expansion of the electrical connectors is much greater than in the case of a standard printed circuit board. The problem is exacerbated by the fact that known materials whose coefficients of thermal expansion lie close to the coefficient of thermal expansion of the board and have good electrical properties are not easily worked and are therefore unsuitable for use as electrical connectors.

It is important to solve the aforesaid problem and therewith enable electrical connectors to be surface mounted on a hard multilayer substrate, in order to be able to utilise the advantages afforded by hard multilayer substrates, namely the advantages concerning electrical connection via conductors in the substrate to the hermetically sealed capsule, instead of via the capsule wall.

The aforesaid problem is solved in accordance with the present invention with the aid of a shim which is intended to be fastened between the printed circuit board and the electrical connector such as to mount said connector on the board. The coefficient of thermal expansion of the shim lies between the respective coefficients of thermal expansion of the printed circuit board and the electrical connector. In one embodiment, the outer surface of the shim is metallised so as to enable it to be soldered.

The aforesaid problem is also solved with an electrical connector that is comprised essentially of a material having a first coefficient of expansion. That side of the connector which lies proximal to the printed circuit board has an equalising layer of material whose coefficient of thermal expansion lies between the first coefficient of expansion and the coefficient of expansion of the circuit board. The surface of the equalising layer is solderable.

The aforesaid problem is also solved by a method of mounting a component, for instance an electrical connector, to a printed circuit board, in which method there is chosen an intermediate shim that has a coefficient of thermal expansion which lies between the coefficient of expansion of the printed circuit board and the electrical connector. One side of the shim is soldered to the electrical connector and the other side soldered to the circuit board.

According to one embodiment, the inventive shim is made from metal sheet comprising the metal alloy FC15 and is gold-plated so as to be solderable. The shim includes an aperture through which an electrical conductor can be threaded, wherewith the electrical potential of the conductor shall be separated from the electrical potential when connecting the conductor to the circuit board via the shim.

The present invention provides the advantage of distributing the shear stresses that occur between the circuit board and the component on two joints instead of only one. Furthermore, a solder joint is slightly elastic, as opposed to the printed circuit board, the component and the shim. A greater degree of elasticity is obtained when fastening the component to the circuit board with two solder joints instead of only one.

A further advantage is that the shim enlargens the soldering surface on the circuit board. Wider soldering surfaces result in better attachment.

Still another advantage afforded by the invention resides in the ability of utilising the good properties of material that have a coefficient of thermal expansion which lies close to the coefficient of thermal expansion of the printed circuit board, without needing to use this for the entire component. For instance, it is much easier to produce a shim by etching than to produce an electrical connector from the metal alloy FC15.

Yet another advantage afforded by the inventive shim is that it enables a standard electrical connector to be mounted on a hard multilayer substrate.

The invention will now be described in more detail with reference to preferred embodiments thereof and also with reference to the accompanying drawing.

DESCRIPTION OF PREFERRED EMBODIMENTS

Figure 1:
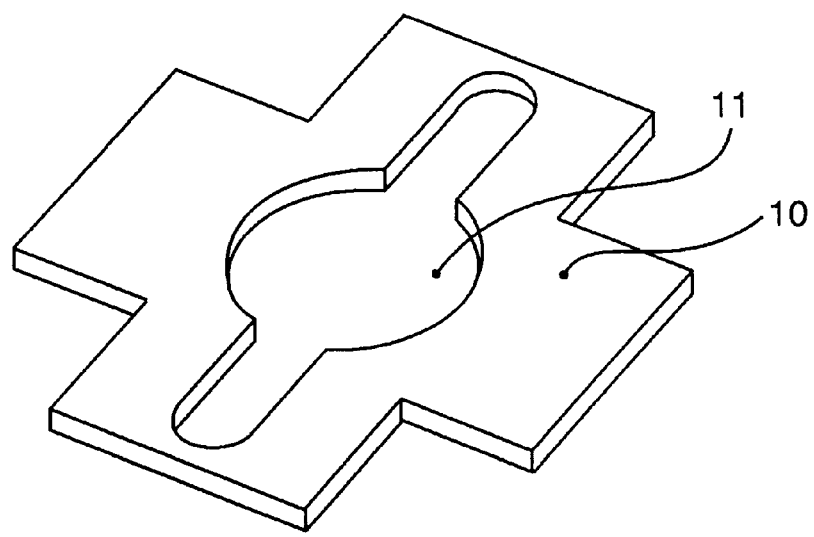
FIG. 1 illustrates an inventive shim.

FIG. 1 shows a so-called shim 10 which is intended to be fastened between a typical MCX connector and a hard multilayer substrate. By hard multilayer substrate is meant in this document a printed circuit board comprised essentially of a ceramic material and including layers of electric conductors. Such substrates are found under the designation LTCC substrate (Low Temperature Cofired Ceramic) and HTCC substrate (High Temperature Cofired Ceramic), among others. Hard substrates are also designated inorganic substrates.

The shim has been etched from metal sheet comprised of the metal alloy FC15, and then plated with gold so as to be solderable. It has a thickness of 0.3 mm.

The shim 10 includes four cut-outs for accommodating the four legs of the connector pin. The shim also includes an aperture 11. The aperture 11 is centred in the middle of the shim, but has a narrower extension in two directions which terminate short of the outer limitation of the shim.

Figure 2:
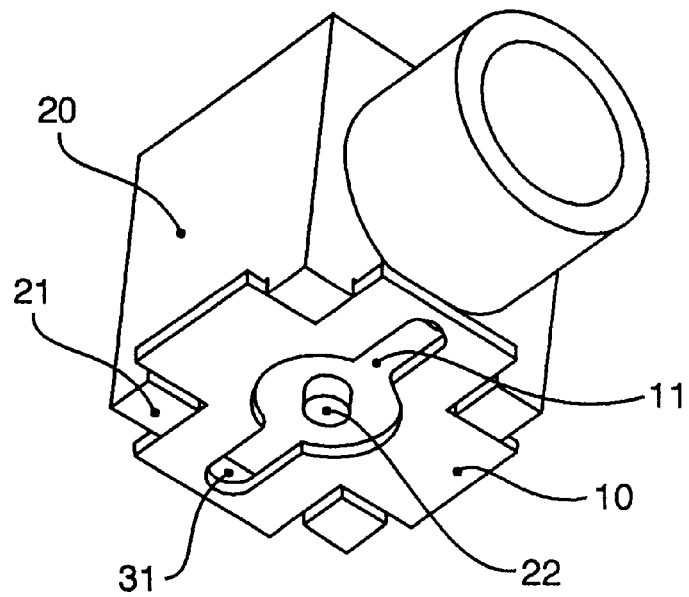
FIG. 2 illustrates an electrical connector fitted with a shim.

FIG. 2 is a perspective view of a typical MCX connector 20 from beneath, i.e. from that end which is to be mounted on the hard multilayer substrate. The MCX connector 20 enables a coaxial cable to be connected to the substrate. The shim 10 is mounted on the underside of the MCX connector. The MCX connector includes four legs 21 on the underside thereof. The MCX connector 20 is originally intended for mounting on a printed circuit board that includes plastic insulating layers instead of ceramic layers Each of the four legs 21 is soldered to the surface of such a circuit board.

In the case of the present invention, however, the MCX connector is mounted in a different way. The legs 21 have a height of 0.5 mm. The cut-outs in the shim 10 fit in between the four legs 21. The surface of the shim 10 extends slightly beyond the underside of the connector. On the other hand, the whole of the first side of the shim lying against the MCX connector is soldered firmly with a 0.1 mm thick solder joint. The solder joint and shim together fill up 0.4 mm of the length extension of the 0.5 mm long legs 21. The other side of the shim 10 is then soldered firmly to the circuit board. The remaining 0.1 mm of the length of the legs 21 is taken up by the solder joint between the other side of the shim and the printed circuit board.

FIG. 2 also shows a pin 22 in the centre of the aperture 11 in the shim 10. The pin 22 is a part of the connector 20 and is an electrical conductor whose electrical potential is different to the electrical potential at the contact surface or interface between the shim 10 and the connector 20. The pin 22 shall be connected to a corresponding point on the printed circuit board.

The aperture 11 in the shim 10 is not completely filled by the end of the connector subsequent to soldering, and a small opening 31 is left at the end of the aperture.

Figure 3:
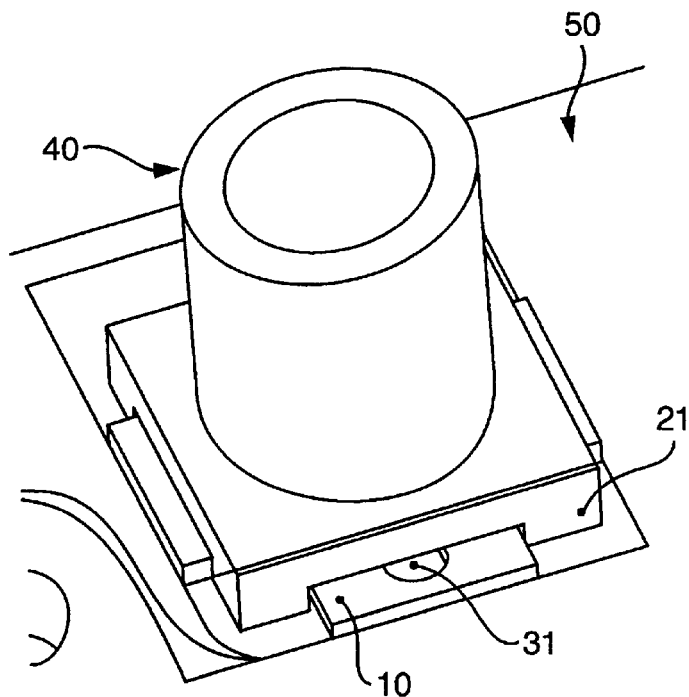
FIG. 3 illustrates an electrical connector and shim mounted on a printed circuit board.

FIG. 3 shows an MCX connector 40 mounted on a hard multilayer substrate 50 with the aid of the shim 10. The only difference between the MCX connector 40 shown in FIG. 3 from the MCX connector 20 shown in FIG. 2 is that a coaxial cable is connected perpendicular to the substrate instead of parallel therewith. The design and sizes of that side which lies proximal to the substrate are the same in both cases.

FIG. 3 shows the MCX connector 40 straddling the shim 10. The end surfaces of the legs 21 rest against the substrate 50. The connector 40 is secured to the substrate 50, by soldering its side surface between the legs 21 to the first side of the shim 10, while soldering the second side of the shim 21 onto a corresponding metal surface of the substrate 50. The space between the printed circuit board 50 and the connector 40 corresponding to the height of said legs is thus filled by the shim and the two solder joints.

When soldering the connector 40 with its shim 10 onto the hard multilayer substrate 50, the pin 22 is also soldered to a corresponding electrical conductor, so-called solder pad, of a precise size. Glue is ejected down into the opening 31 after completion of the soldering process, so as to further fixate the pin 22 in the centre of the aperture 11.

The connected 20, 40 is configured so that its four legs 21 can be soldered against a printed circuit board. This mounting of the connector to a typical printed circuit board that has plastic insulating layers instead of ceramic layers will function satisfactorily at moderate temperature variations. However, this method will not function satisfactorily when mounting the connector on the hard multilayer substrate 50. The MCX connectors 20, 40 are comprised of ferritic steel. This material is well suited from a magnetic/electrical aspect and can be worked readily easily to form the connector 20, 40. One drawback, however, is that its coefficient of thermal expansion differs markedly from the coefficient of thermal expansion of the hard multilayer substrate 50.

The inventive shim 10 widens the soldering surface area on the circuit board, therewith improving attachment or adhesion capacity.

According to one alternative embodiment, a connector is provided with a shim 10 so as to enable the connector to be mounted directly onto a hard multilayer substrate. The connector is comprised substantially of a material that is electrically/magnetically appropriate and that can be easily worked, for instance ferritic steel. Located at that end of the connector which will lie proximal to the circuit board is a so-called shim 10 that has a coefficient of thermal extension which lies between that of the circuit board and that of the ferritic steel, e.g. FX15. The shim is soldered to the ferritic metal. The shim is also plated with solderable material, so that it can be soldered to the circuit board 50.

The inventive shim 10 is soldered onto an earth plane on the substrate 50. The distance between said earth plane and the centre pin of the MCX connector influences the impedance. The distance shall be such as to adapt the impedance load to the coaxial cable to be connected. The distance from the edge of the shim aperture 11 to the centre pin 22 shall be of the same order of magnitude as the distance between the earth plane and the centre pin 22 if no shim 10 had been used.

Figure 4:
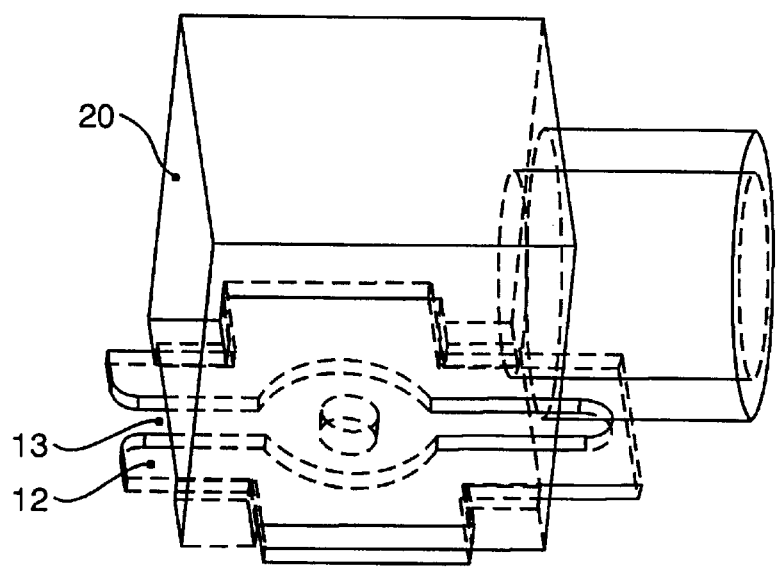
FIG. 4 illustrates an electrical connector with an alternative shim.

An alternative embodiment of the inventive shim 12 is shown in FIG. 4, in a view from the upper side of the MCX connector 20. The shim 12 is mounted on the underside of the MCX connector 20, i.e. on that side of the connector which lies proximal to the substrate 50. Obstructed lines are shown in broken lines. The shim 12 in FIG. 4 differs from the earlier described shim 10 by virtue of the fact that the aperture 11 which accommodates the centre pin 22 of the MCX connector is open in one edge of the shim 12, such that the aperture will actually form in the plate a slot 13 that extends from one edge of the shim 12. The slot 13 is widened in a circular form in the centre of the shim 12, around the centre pin 22. This embodiment facilitates gluing of the centre pin 22.

Those joints that fasten the shim 10 have been exemplified above as solder joints. A solder joint may either be made with soft solder or with hard solder. Joints other than solder joints may be used, provided that said joints are electrically conductive. For instance, the joints may be made with an epoxy glue to which small silver beads or metal-plated glass beads have been mixed.

The electric connector of the aforedescribed embodiments is an MCX connector. It will be understood, however, that other types of connector can be connected to the hard multilayer substrate in the aforedescribed manner while using the aforedescribed shim. The connectors may be intended for the connection of a coaxial cable or for connection to a supply voltage.

As will be understood, the method, shim and connector can also be used for connecting electrical connectors to printed circuit boards other than hard multilayer substrates and can be used conveniently where temperature variations would otherwise result in significant shear stresses between board and connector material. Components other than electrical connectors can be fastened to the circuit board with the aid of an inventive shim, for instance a cooling flange, a capacitor or fastener device. The thermally conductive properties of the joint are important when the component mounted is a cooling flange or fin. A solder joint has good thermal conductivity. The invention enables the material in the circuit board and in the component to be utilised together, which combined use would otherwise be excluded due to the differences in the thermal expansion coefficients of these materials.

In the illustrated and described embodiments, the shim is made of FC15. FC15 is an alloy of cobalt, nickel and iron normally retailed under the name Covar. FC15 is a suitable shim material, when the connector 20, 40 is made of ferritic steel and the printed circuit board 50 is an LTCC substrate. The coefficient of thermal expansion of FC15 is close to the coefficient of thermal expansion of the LTCC substrate. Practical trials have shown that the solder joints manage thermal stress effectively in the case of an FC15 shim, and it is found to be convenient to choose a coefficient of thermal expansion which lies closer to that of the substrate 50 than to that of the connector 20, 24. It will be understood that the shim 10, 12 may be comprised of some other material, provided that this material is adapted to the materials in the circuit board 50 and the component, and that the coefficient of thermal expansion of said other material lies between that of the circuit board 50 and of the component.

In the described embodiments, an intermediate material permitting two elastic joints to be obtained has been used between the circuit board and the main material of the connector. However, several layers with sequentially more joints can be used in accordance with this principle to distribute shear stresses between the main material of the connector and the printed circuit board.

It will be understood that the invention is not restricted to the described and illustrated exemplifying embodiments thereof, and that modifications can be made within the scope of the accompanying claims.

What is claimed is:

1. A metal shim comprising an aperture through which an electric connecter can be threaded and fastened between an electrical connector that has a first coefficient of thermal expansion and a printed circuit board that has a second coefficient of thermal expansion, wherein one side of the metal shim is fastened with a first solder joint to the electrical connector and the other side of the metal shim is fastened with a second solder joint to the printed circuit board, therein connecting the electrical connector electrically to the printed circuit board.

2. A shim according to claim 1 that has a solderable outer layer.

3. A shim according to claim 1 that has an extension beyond the place of abutment of the connector with said shim, wherein said aperture extends beyond the place of abutment of the connector with said shim.

4. An electrical connector which comprises mainly a first material having a first coefficient of thermal expansion to be connected to a printed circuit board that has a second coefficient of thermal expansion, comprising:

a metal shim comprising a threaded aperture and fastened with a first joint on the side of the electrical connector to be mounted on said board, wherein a second joint fastens said metal shim to said board and wherein the electrical connector is connected to said board through the threaded aperture.

5. An electrical connector according to claim 4 whose contact side is plated with a solderable material.

6. A method of fastening an electrical connector having a first coefficient of thermal expansion to a ground plane on a printed circuit board that has a second coefficient of thermal expansion, comprising:

a) choosing a metal shim having a predetermined coefficient of thermal expansion;

b) soldering one side of said shim and said connector;

c) soldering the other side of said shim and said printed circuit board; and d) threading an electric conductor through an aperture in said shim and soldering the conductor to the printed circuit board.

7. A method according to claim 6 in which soldering according to step b) and step c) is preceded by plating the shim with solderable material.

8. A method according to claim 6 comprising the further step of e) gluing the conductor in said aperture.

9. A printed circuit board on which a electromechanical component is mounted, wherein the printed circuit board has a first coefficient of thermal expansion and the component has a second coefficient of thermal expansion, comprising:

a metal shim which includes an aperture through which an electric conductor can be threaded and which is mounted between the printed circuit board and said component with a first joint that fastens a first side thereof to said component and with a second joint that fastens the second side thereof to said printed circuit board.

10. A printed circuit board according to claim 9 where said board is comprised of a hard multilayer substrate.

11. Metal shim according to claim 1, wherein the first solder joint covers the entire contact area between the metal shim and the electrical connector, and wherein the second solder joint covers the entire contact area between the metal shim and the printed circuit board.

12. Metal shim according to claim 11, further wherein the entire contact area between the metal shim and the printed circuit board is greater than what the contact area between the electrical connector and the printed circuit board would be without a metal shim.

13. Metal shim according to claim 1, wherein the coefficient of thermal expansion of the metal shim lies between the first and the second coefficients of thermal expansion.

14. Metal shim according to claim 1, wherein the shim is made of metal alloy FC15.

15. Electrical connector according to claim 4, further wherein said first and second joints are solder joints.

16. Electrical connector according to claim 4, further wherein said electrical connector is a MCX connector and said printed circuit board is a hard multilayer substrate.

17. Method according to claim 6, wherein the step of choosing a metal shim further comprises the step of choosing a metal shim whose coefficient of thermal expansion lies closer to the second coefficient of thermal expansion than to the first coefficient of thermal expansion.

18. System according to claim 9, wherein the metal shim has a coefficient of thermal expansion that lies between said first and said second coefficient of thermal expansion.

19. System according to claim 9, wherein first and second elastic joints are solder joints.

* * * * *